(12) United States Patent
Yamamoto

(10) Patent No.: US 8,022,396 B2
(45) Date of Patent: Sep. 20, 2011

(54) SEMICONDUCTOR DEVICE INCLUDING AN INSULATING LAYER RESISTANT TO A PHOTOLITHOGRAPHY PROCESS, ELECTRONIC DEVICE, AND ELECTRONIC EQUIPMENT

(75) Inventor: Hitoshi Yamamoto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 161 days.

(21) Appl. No.: 11/834,922

(22) Filed: Aug. 7, 2007

(65) Prior Publication Data

US 2008/0042130 A1 Feb. 21, 2008

(30) Foreign Application Priority Data

Aug. 17, 2006 (JP) ................................ 2006-222304

(51) Int. Cl.
 *H01L 29/08* (2006.01)
(52) U.S. Cl. ............................................. 257/40; 438/99
(58) Field of Classification Search ...................... 257/40
 See application file for complete search history.

(56) References Cited

U.S. PATENT DOCUMENTS

| | | | |
|---|---|---|---|
| 5,658,994 A | 8/1997 | Burgoyne, Jr. et al. | |
| 6,905,906 B2 * | 6/2005 | Sirringhaus et al. | 438/99 |
| 7,180,108 B2 * | 2/2007 | Kawase et al. | 257/288 |
| 2005/0033011 A1 * | 2/2005 | Seki et al. | 528/229 |
| 2006/0289859 A1 * | 12/2006 | Yoneya | 257/40 |
| 2007/0296047 A1 | 12/2007 | Kretz et al. | |

FOREIGN PATENT DOCUMENTS

| | | |
|---|---|---|
| JP | A-09-202823 | 8/1997 |
| JP | A-2001-91722 | 4/2001 |
| JP | 2004083855 A * | 3/2004 |
| JP | A-2004-085637 | 3/2004 |
| JP | A 2005-101555 | 4/2005 |
| JP | A-2005-325331 | 11/2005 |
| JP | A-2007-321152 | 12/2007 |

OTHER PUBLICATIONS

"Organic Syntheses," Methods of Organic Chemistry, vol. 2-4, pp. 3-5, pp. 138-139, pp. 203-204 and pp. 510-512 and pp. 510-512, Jan. 1942.

* cited by examiner

*Primary Examiner* — Thao Le
*Assistant Examiner* — Geoffrey Ida
(74) *Attorney, Agent, or Firm* — Oliff & Berridge, PLC

(57) ABSTRACT

A semiconductor device includes: an organic semiconductor layer made of an organic semiconductor material; a gate electrode for applying an electric field to the organic semiconductor layer; a first insulating layer insulating the gate electrode from the organic semiconductor layer; and a second insulating layer. The organic semiconductor layer is located between the first insulating layer and the second insulating layer, and the second insulating layer is composed of a polymer having a fluorene skeleton.

10 Claims, 6 Drawing Sheets

SEMICONDUCTOR DEVICE INCLUDING AN INSULATING LAYER RESISTANT TO A PHOTOLITHOGRAPHY PROCESS, ELECTRONIC DEVICE, AND ELECTRONIC EQUIPMENT

BACKGROUND

1. Technical Field

The present invention relates to a semiconductor device, an electronic device, and electronic equipment.

2. Related Art

The development of thin film transistors (organic semiconductor devices) using organic materials (organic semiconductor materials) that exhibit semiconducting electrical conductivity has been recently progressed.

These thin film transistors have advantages such as suitability for being thinned and lightened, flexibility, low material costs, and so forth, so as to be expected as a switching element of a flexible display and so forth.

Such thin film transistors include a transistor disclosed in JP-A-2005-101555, for example. The transistor has such structure that an insulating layer including aromatic compound and/or aromatic ring containing polymer is formed on an organic semiconductor layer at an opposite side to a gate insulating layer for an improvement of carrier mobility.

However, this thin film transistor still requires further study due to insufficient improvement of its other characteristics, especially ON-OFF ratio.

SUMMARY

An advantage of the present invention is to provide an organic semiconductor device of which an insulating layer is resistant to a photolithography process and characteristics are excellent (high ON-OFF ratio, small Vth shift, and small OFF-current), and an electronic device and electronic equipment that include such organic semiconductor devices and have high reliability.

A semiconductor of one aspect of the invention includes: an organic semiconductor layer made of an organic semiconductor material; a gate electrode for applying an electric field to the organic semiconductor layer; a first insulating layer insulating the gate electrode from the organic semiconductor layer; and a second insulating layer. The organic semiconductor layer is located between the first insulating layer and the second insulating layer, and the second insulating layer is composed of a polymer having fluorene skeleton.

Therefore, an organic semiconductor device having an insulating layer resistant to photolithography, and excellent characteristics (large ON-OFF ratio, small Vth shift, and small OFF-current) can be obtained.

In the semiconductor device of the aspect, a main chain of the polymer may include an oxygen atom.

The polymer including an oxygen atom can be polyester or polyether.

In the semiconductor device, the polymer may be obtained by copolymerizing a first polymerizable monomer including the fluorene skeleton, and a second polymerizable monomer including at least one of an epoxy group, an oxetane group, an acrylic acid group, and a methacrylic acid group.

In the semiconductor device, the first polymerizable monomer may have a structure shown in Structural Formula 1, and the second polymerizable monomer may have a structure shown in Structural Formula 2 or Structural Formula 3.

[Structural Formula 1]

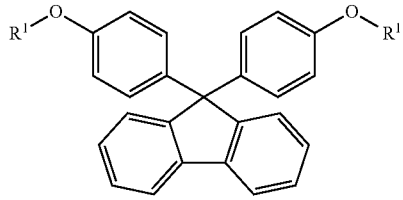

(1)

[Structural Formula 2]

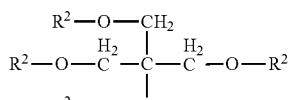

(2)

[Structural Formula 3]

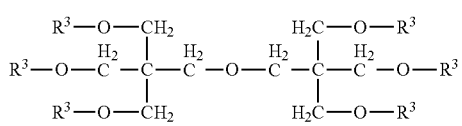

(3)

, $R^1$, $R^2$, and $R^3$ in above formulas respectively represent the following. All of $R^1$s are same substituents and have a hydrogen atom or a structure shown in any of Formulas 4 to 8. At least two of $R^2$s are same substituents and $R^2$s have a hydrogen atom or a structure shown in any of Formulas 4 to 8. At least three of $R^3$s are same substituents and $R^3$s have a hydrogen atom or a structure shown in any of Formulas 4 to 8.

[Formula 4]

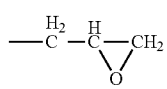

(4)

[Formula 5]

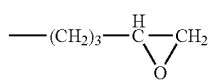

(5)

[Formula 6]

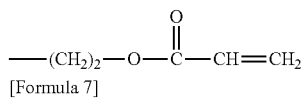

(6)

[Formula 7]

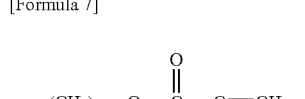

(7)

[Formula 8]

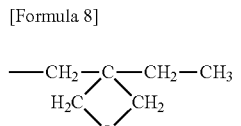

(8)

In the semiconductor device, the polymer may have a polyester skeleton.

In the semiconductor device, the polymer may include a first structural portion derived from the first polymerizable monomer and a second structural portion derived from the second polymerizable monomer, and may be 25 mol % to 75 mol % of the first structural portion.

In the semiconductor device, the organic semiconductor material of the organic semiconductor layer may have crystallinity. The organic semiconductor layer may be located between the second insulating layer and the gate electrode.

In the semiconductor device, an average thickness of the second insulating layer may be 0.01 μm to 100 μm.

Setting the average thickness of the second insulating layer in the above range can prevent the substrate and the organic semiconductor layer from directly contacting each other, and the organic semiconductor device from deteriorating its flexibility when the flexibility is added.

An electronic device of a second aspect of the invention includes the semiconductor device of the first aspect.

Electronic equipment of a third aspect of the invention includes the electronic device of the second aspect.

BRIEF DESCRIPTION OF THE DRAWINGS

The invention will be described with reference to the accompanying drawings, wherein like numbers reference like elements.

DESCRIPTION OF EXEMPLARY EMBODIMENT

An organic semiconductor device, an electronic device, and electronic equipment of the present invention will now be described based on preferred embodiments.

Hereinafter, an active matrix device to which an organic semiconductor device of the present invention is applied will be described as an example.

Active Matrix Device

Figure 1:
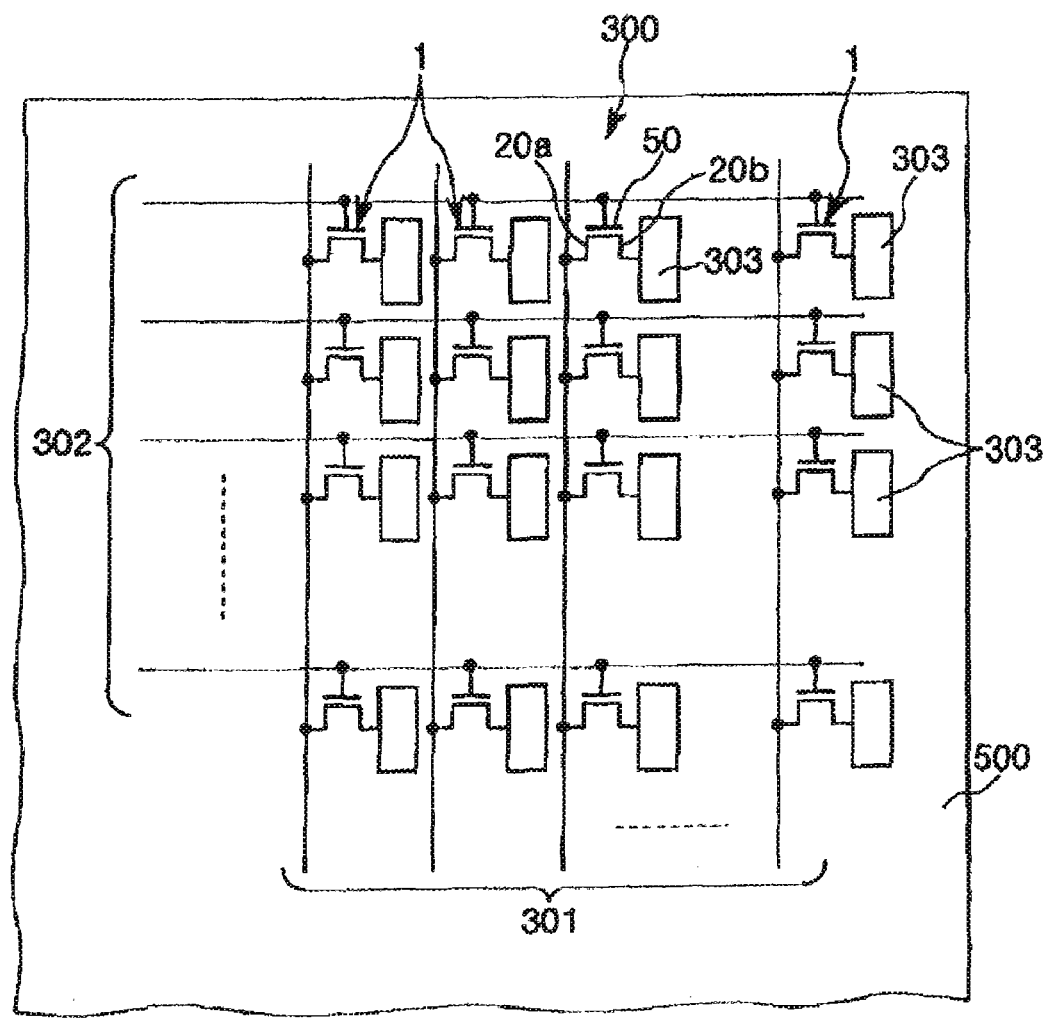
FIG. 1 is a block diagram showing a structure of an active matrix device to which an organic semiconductor device of the present invention is applied.
Figure 2A:
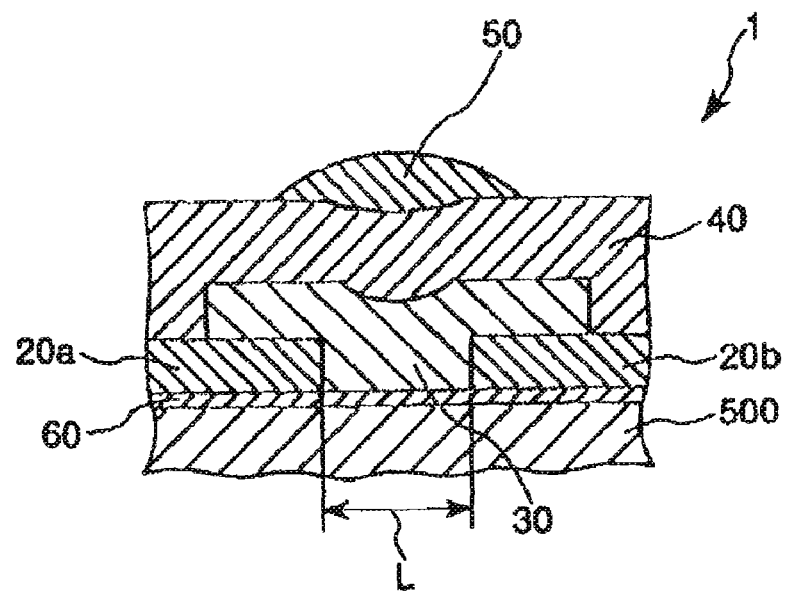
FIGS. 2A and 2B are respectively a longitudinal sectional view and a plan view showing a structure of an organic thin film transistor of the active matrix device of FIG. 1.
Figure 2B:
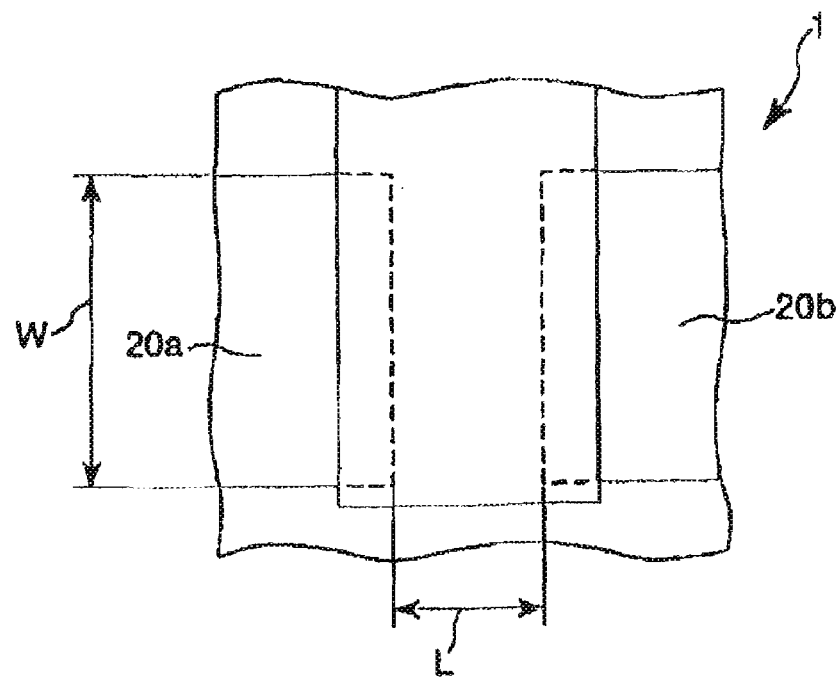

FIG. 1 is a block diagram showing a structure of an active matrix device to which the organic semiconductor device of the present invention is applied. FIGS. 2A and 2B are respectively a longitudinal sectional view and a plan view showing a structure of an organic thin film transistor provided to the active matrix device of FIG. 1. FIGS. 3A to 3E and FIG. 4 are longitudinal sectional views explaining a method for manufacturing the organic thin film transistor of FIGS. 2A and 2B. In the following description, the upside in FIG. 2A to FIG. 4 is described as "up", while the downside is described as "down".

This active matrix device 300 in FIG. 1 includes a substrate 500, a plurality of data lines 301, a plurality of scanning lines 302, an organic thin film transistor 1 (hereinafter, referred to as "a thin film transistor"), and a pixel electrode (an individual electrode) 303. The data lines 301 and the scanning lines 302 are provided perpendicular to each other on the substrate 500. The thin film transistor 1 is provided in the vicinity of each intersection of the data lines 301 and the scanning lines 302.

A gate electrode 50, a source electrode 20a, and a drain electrode 20b included in the thin film transistor 1 are respectively connected to the scanning line 302, the data line 301, and the pixel electrode 303.

The thin film transistor 1 of the embodiment has a top-gate structure (is top-gate type) in which the source electrode 20a and the drain electrode 20b are located closer to the substrate 500 than the gate electrode 50.

In particular, as shown in FIG. 2A, this thin film transistor 1 includes a lower layer (a second insulating layer) 60 provided on the substrate 500; the source electrode 20a and the drain electrode 20b which are formed separately on the lower layer 60; an organic semiconductor layer 30 provided in contact with the source electrode 20a and the drain electrode 20b; a gate insulating layer 40 located between the organic semiconductor layer 30 and the gate electrode 50.

Each element will now be described in detail.

The substrate 500 supports each layer (each element) making up the thin film transistor 1 (the active matrix device 300).

Examples of the material of the substrate 500 include a glass substrate; a plastic substrate (a resin substrate) containing polyethylene terephthalate (PET), polyethylene naphthalate (PEN), polyethersulfone (PIES), polyimide (PI), polycarbonate (PC) and the like; a quartz substrate; a silicon substrate; a metal (iron, stainless, aluminum, copper, and the like) substrate; a gallium arsenide substrate; and the like.

A case providing flexibility to the thin film transistor 1 selects a plastic substrate (a substrate mainly made of polymer materials) or a thin metal substrate (a substrate having relatively small film-thickness) as the substrate 500.

On the substrate 5(30, the lower layer (a buffer layer) 60 is provided in contact with the organic semiconductor layer 30 described later.

One of the features of the embodiment is that the lower layer 60 is made of resin materials including polyester. Details on this point (feature) will be described later.

On the lower layer 60, the source electrode 20a and the drain electrode 20b are formed with predetermined interval therebetween.

Examples of the constituent materials of the source electrode 20a and the drain electrode 20b include metal materials such as Au, Ag, Cu. Pt, Ni, Cr, Ti, Ta, Al, or their alloy. These may be used singly or in combination of two or more of them.

Among these, Au, Ag, Cu, and Pt, or their alloy are especially preferable as the constituent materials of the source electrode 20a and the drain electrode 20b. These materials have relatively large work functions, so that forming the source electrode 20a by these materials can enhance the hole (carrier) injection efficiency to the organic semiconductor layer 30, when the in organic semiconductor layer 30 is p-type.

The average thickness of the source electrode 20a and the drain electrode 20b is not particularly limited, but preferably about 10 nm to 2000 nm, more preferably about 50 nm to 1000 nm.

The distance between the source electrode 20a and the drain electrode 20b, namely a channel length r shown in FIGS. 2A and 2e, is preferably about 2 µm to 30 µm, more preferably about 2 µm to 20 µm. Setting the value of the channel length L in such ranges improves the characteristics of the thin film transistor 1 (especially, increase of ON-current value).

Further, the length of the source electrode 20a and the drain electrode 20b, namely a channel width W shown in FIG. 2B is preferably about 0.1 mm to 5 mm, more preferably about 0.3 mm to 3 mm. Setting the value of the channel width W in such ranges reduces parasitic capacitance, preventing the characteristics of the thin film transistor 1 from deteriorating. Further, the thin film transistor 1 can be also prevented from growing in size.

The organic semiconductor layer 30 is formed to contact the source electrode 20a and the drain electrode 20b.

Examples of the constituent materials oaf the organic semiconductor layer 30 include: high-polymer organic semiconductor materials such as poly(3-alkylthiophene), poly(3-hexylthiophene) (P3HT), poly(3-octylthiophene), poly(2,5-thienylenevinylene) (PTV), poly(para-phenylene vinylene) (PPV), poly(2-methoxy-5-(2'-ethylhexyloxy)-para-phenylenevinylene) (MEH-PPV), poly(9,9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triaryl amine copolymer, triarylamine based polymer, fluorene-bithiophene copolymer (F8T2); and low-molecular organic semiconductor materials such as metal phthalocyanine like fullerene, copper phthalocyanine, or their derivative; asene molecule materials like anthracene, tetracene, pentacene, hexacene, and the like; α-oligothiophene compounds like quaterthiophene (4T), sexithiophene (6T), octithiophene (8T), dihexyl-quaterthiophene (DH4T), dihexyl-sexithiophene (DH6T), and the like. These may be used singly or in combination of two or more of them. All these organic semiconductor materials are crystalline, and especially excellent in semiconductor characteristic.

Among these, it is especially preferable to use a material mainly containing polymer organic semiconductor materials that generally have high carrier transportation capability.

The organic semiconductor layer 30 mainly including polymer organic semiconductor materials can be formed thin and light, and is superior in flexibility. Therefore, the organic semiconductor layer 30 is suitably applied to a thin film transistor used as a switching element of a flexible display and so forth.

The average thickness of the organic semiconductor layer 30 is not particularly limited, but preferably about 0.1 nm to 1000 nm, more preferably about 1 nm to 600 nm, and further preferably about 1 nm to 100 nm.

The organic semiconductor layer 30 may be selectively formed in a region between the source electrode 20a and the drain electrode 20b (a channel region) or may be formed so as to cover approximately the whole of the source electrode 20a and the drain electrode 20b.

Contacting the organic semiconductor layer 30 and covering the organic semiconductor layer 30, the source electrode 20a, and the drain electrode 20b, the gate insulating layer 40 is formed.

The gate insulating layer 40 insulates a gate electrode 50, which is described later, from the source electrode 20a and the drain electrode 20b.

The average thickness of the gate insulating layer 40 is not limited, but preferably about 10 nm to 5000 nm, and more preferably about 100 nm to 2000 nm. Setting the thickness of the gate insulating layer 40 in such ranges can lower an operating voltage of the thin film transistor 1 while surely insulating the gate electrode 50 from the source electrode 20a and the drain electrode 20b.

On a predetermined position on the gate insulating layer 40, namely, a position corresponding to the region between the source electrode 20a and the drain electrode 20b, the gate electrode 50 applying an electric field to the organic semiconductor layer 30 is provided.

Examples of the constituent materials of the gate electrode 50 include: metal materials such as Pd, Pt, Au, W, Ta, Nb, Al, Cr, Ti, Cu, or their alloy; carbon materials such as carbon black, carbon nanotube, fullerene, and the like; and conductive polymer materials such as polythiophene like polyacetylene, polypyrrole, and poly(3,4-ethylenedioxylthiophene) (PEDOT), polyaniline, poly(p-phenylene), polyp phenylenevinylene), polyfluorene, polycarbazole, polysilane, or their derivatives and these mixture. These materials may be used singly or in combination of two or more of them. Examples of the mixture system of the conductive polymer materials include poly(3,4-ethylenedioxythiophene) (PEDOT)/poly-styrenesulfonate) (PSS) can be used as.

The average thickness of the gate electrode 50 is not specifically limited, but preferably about 0.1 nm to 2000 nm, more preferably about 1 nm to 1000 nm.

With a voltage applied in between the source electrode 20a and the drain electrode 20b of the thin film transistor 1, applying a gate voltage to the gate electrode 50 makes a channel in the organic semiconductor layer 30 near the interface with the gate insulating layer 40. As carriers (holes) move in this channel region, a current flows between the source electrode 20a and the drain electrode 20b.

More specifically, when no voltage is applied to the gate electrode 50, namely in OFF-state, even if a voltage is applied in between the source electrode 20a and the drain electrode 20b, only a small amount of current flows due to few carriers in the organic semiconductor layer 30.

On the other hand, when a voltage is applied to the gate electrode 50, namely in ON-state, electric charges are induced to a region where the organic semiconductor layer 30 faces the gate insulating layer 40 to form a channel (a path for carriers). Under this state, if a voltage is applied in between the source electrode 20a and the drain electrode 20b, a current flows through the channel.

Next, the lower layer 60 will be described.

The lower layer 60 is made of resin materials containing polyester (preferably, polyester based resin materials), and formed to contact the organic semiconductor layer 30 on the side opposite to the gate insulating layer 40.

Here, the constituent materials of a layer (a member) contacting the organic semiconductor layer 30 affects to change the characteristics of the organic semiconductor layer 30.

The layer made of, for example, high-polymer materials such as common polyethylene, polystyrene, and the like, or metallic materials (especially, stainless) causes deterioration of the transistor characteristics such as ON-OFF ratio.

On the other hand, forming the lower layer 60 contacting the organic semiconductor layer 30 between the substrate 500 and the organic semiconductor layer 30 improves the transistor characteristics such as ON-OFF ratio.

Among various materials, when the lower layer 60) is made of especially polyether or polyester resin materials containing a monomer unit being a hard segment and expressed by Structural Formula I and a monomer unit being a soft segment and expressed by Structural Formulas II-1 and II-2, the characteristics of the organic semiconductor layer 30 can be improved (increase of an ON-OFF ratio, decrease of Vth shift, and suppression of an OFF-current value). The monomer unit expressed by Structural Formula I has a fluorene skeleton for smoothing the carrier transportation of the organic semiconductor layer, and ether (-o-) group trapping impurity carriers from the atmosphere. The monomer unit expressed by Structural Formulas II-1 and II-2 has ether (-o-) group trapping impurity carriers from the atmosphere, and is a multifunctional (trifunctional or hexafunctional) monomer which has excellent solvent-resistance obtained by polymerizing and stericly crosslinking.

In other words, the invention is preferably applied to the thin film transistor 1 having the top-gate structure in which the substrate 500 is made of mainly polymer materials or metal materials. Further, when the organic semiconductor layer 30 is made of crystalline organic semiconductor materials, the above advantageous effects become prominent.

Further, providing the lower layer 60 allows the substrate 500 to be made of any materials. Namely, the substrate 500 can be formed inexpensively, being able to reduce the manufacturing cost of the thin film transistor 1.

Various polyethers or polyesters are available to the invention, but those having a first polymerizable monomer structure and a second polymerizable monomer structure are preferable. The first polymerizable monomer structure has two polymerizable functional groups at a molecular end, -o- group in a molecule excluding the polymerizable functional groups portion, and a fluorene skeleton as a partial skeleton. The second polymerizable monomer structure has at least three polymerizable functional groups at a molecular end, -o- group in a molecular excluding the polymerizable functional groups portion. The polymerizable functional group included in the first polymerizable monomer structure and the second polymerizable monomer structure is any of epoxy group, oxetane group, acrylic acid group, and methacrylic acid group.

Further, polyethers or polyesters having at least one monomer structure among the first polymerizable monomer compounds selected from Structural Formula I, and at least one monomer structure among the second polymerizable monomer compounds selected from Structural Formula II-1 or Structural Formula II-2 are preferable.

[Structural Formula 1]

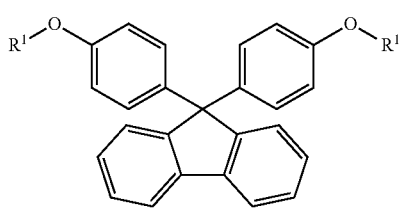

(I)

-continued

[Structural Formula II-1]

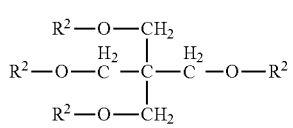

(II-1)

[Structural Formula II-2]

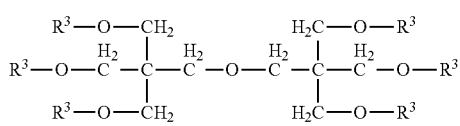

(II-2)

Each of $R^1$, $R^2$, and $R^3$ is any of III-1 to III-5. $R^1$s should not be different groups. One or less of $R^2$ may be a hydrogen atom, but other $R^2$s are the same groups. Two or less of $R^3$s may be a hydrogen atom, but other $R^3$s are the same groups.

[Formula III-1]

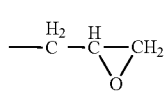

(III-1)

[Formula III-2]

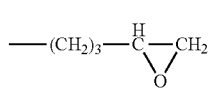

(III-2)

[Formula III-3]

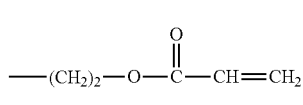

(III-3)

[Formula III-4]

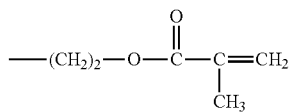

(III-4)

[Formula III-5]

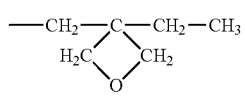

(III-5)

Further, polyethers or polyesters having at least one monomer structure among the first polymerizable monomer compounds selected from Structural Formula IV, and at least one monomer structure among the second polymerizable monomer compounds selected from Structural Formula V-1 or Structural Formula V-2 are especially preferable.

[Structural Formula IV]

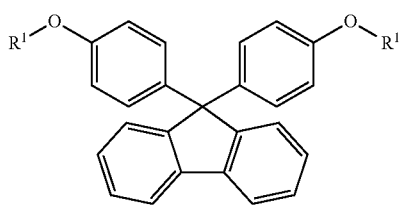
(IV)

[Structural Formula V-1]

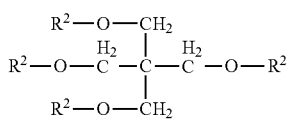
(V-1)

[Structural Formula V-2]

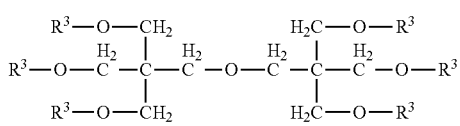
(V-2)

Each of $R^1$, $R^2$s and $R^3$ is any of VI-1 or VI-2. $R^1$s should not be different groups. One or less of $R^2$ may be a hydrogen atom, but other $R^2$s are the same groups. Two or less of $R^3$s may be a hydrogen atom, but other $R^3$s are the same groups.

[Formula VI-1]

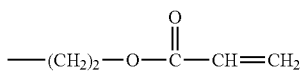
(VI-1)

[Formula VI-2]

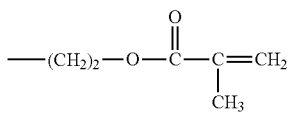
(VI-2)

It is preferable that the first polymerizable monomer be 20 mol % to 80 mol %, and the second polymerizable monomer be 20 mol % to 80 mol %. When the first polymerizable monomer is less than 25 mol %, the lower layer obtained by polymerization becomes soft unpreferably. Further, when the first polymerizable monomer is more than 75 mol %, the lower layer obtained by polymerization becomes fragile unpreferably.

When the first polymerizable monomer is 25 mol % to 80 mol %, the lower layer obtained by the polymerization is preferable due to its solvent resistance, hardness, and characteristics (improvement of ON-OFF ratio, decrease of Vth shift, and suppression of OFF current value). When the first polymerizable monomer is 35 mol % to 80 mol %, the lower layer obtained by the polymerization is especially preferable due to its solvent resistance, hardness, and characteristics (improvement of ON-OFF ratio, decrease of Vth shift, and suppression of OFF current value).

These polyethers or polyesters are preferable due to their especially high advantageous effect improving the characteristics of the thin film transistor 1.

The compound of Structural Formula I is available through Osaka Gus Chemicals Co., Ltd., for example.

In addition, the compound of Structural Formulas II-1 and II-2 is available through Shin-Nakamura Chemical Co., Ltd., or Toagosei Co., Ltd., for example.

Further, compounds of the Structural Formulas I, II-1, and II-2 can be easily produced (synthesized) by optionally combining common organic chemical methods described in, for example, Houben-Wyle, *Methods of Organic Chemistry*, Georg Thieme Verlag, Stuttgart; *Organic Synthesis*, John Wiley &; Sons Inc.; *Organic Reactions*, John Wiley & Sons Inc.; *Comprehensive Organic Synthesis*, Pergamon Press; *Shin-Jikken Kagaku Kouza*, Maruzen; and so forth.

The average thickness of the lower layer (the second insulating layer) 60 is preferably about 0.01 μm to 10 μm, more preferably about 0.1 μm to 0.5 μm. Setting the average thickness of the lower layer 60 in such ranges can prevent the substrate 500 and the organic semiconductor layer 30 from directly contacting each other, and the active matrix device 300 from deteriorating its flexibility when the flexibility is added.

A method for manufacturing the active matrix device 300 will now be described.

Hereinafter, a method for manufacturing the thin film transistor 1 will be primarily described.

Figure 3A:
FIGS. 3A to 3E are longitudinal sectional views explaining a method for manufacturing the thin film transistor of FIGS. 2A and 2B.

[1] Process of Forming Lower Layer (Refer to FIG. 3A)

First, the substrate 500 is prepared. Then, the lower layer 60 is formed on the substrate 500.

The lower layer 60 can be formed by the following process: providing a solution on the substrate 500; next pre-polymerizing the substrate 500 by UV irradiation; then polymerizing by heat; and then removing the solvent to complete the polymerization. The solution is obtained by solving, for example, the monomer of Structural Formulas I, II-1, and II-2 described above and appropriate amount of photo-radical polymerization initiator or photo-cationic polymerization initiator in a solvent.

It makes no difference whether these monomer and photo-radical polymerization initiator or photo-cationic polymerization initiator are solved in the solvent or not.

Examples of the solvent for preparing the solution include: various organic solvents such as ketone solvents like methyl ethyl ketone (MEK), acetone, diethyl ketone, methyl isobutyl ketone (MIBK), methyl isopropyl ketone (MIPK) and cyclohexanon; alcohol solvents like methanol, ethanol, isopropanol, ethylene glycol, diethylene glycol (DEG), and glycerine; ether solvents like diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), and diethylene glycol ethyl ether (carbitol); ester solvents like methyl acetate, ethyl acetate, butyl acetate, and ethyl formate; cellosolve solvents like methyl cellosolve, ethyl cellosolve, and phenyl cellosolve; aliphatic hydrocarbon solvents like hexane, pentane, heptane, and cyclohexane; aromatic hydrocarbon solvents like toluene, xylene, benzene, trimethylbenzene, and tetramethylbenzene; heteroaromatic solvents like pyridine, pyrazine, furan, pyrrole, thiophene, and methylpyrrolidone; amide solvents like N,N-dimethylformamide (DMF), and N,N-dimethylacetamide (DMA); halogenated compound solvents like dichloromethane, chloroform, and 1,2-dichloroethane; sulfur compound solvents like dimethyl sulfoxide (DMSO), and sulfolane; nitrile solvents like acetonitrile, propionitrile, and acrylonitrile; and organic acid solvents like formic acid, acetic acid, trichloroacetic acid, and trifluoroacetic acid; or mixed solvents of these solvents.

Examples of a method for providing the solution on the substrate include a spin-coating method, a casting method, a micro gravure coating method, a gravure coating method, a bar coating method, a roller coating method, a wire bar coating method, a dip coating method, a spray coating method, a screen printing method, a flexographic printing method, an offset printing method, an ink jet method, and a micro-contact printing method. These methods can be used singly or in combination of two or more of them.

Figure 3B:
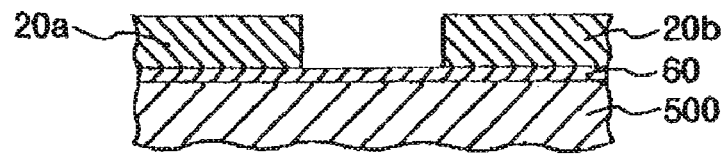
Figure 3C:
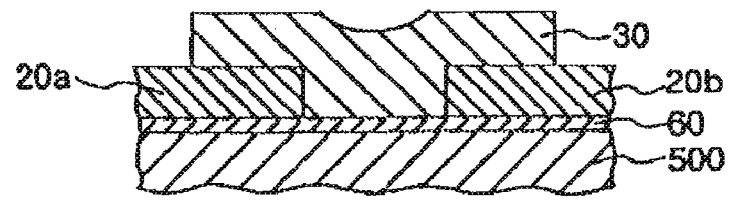

[2] Process of Forming Source Electrode and Drain Electrode (Refer to FIG. 3B)

Next, on the lower layer 60, the source electrode 20a and the drain electrode 20b are formed with predetermined interval therebetween.

First, a metal film (a metal layer) is formed on the substrate 60. The metal film can be formed by, for example, a chemical vapor deposition (CVD) process such as plasma CVD, thermal CVD, and laser CVD; a dry plating process such as vacuum deposition, sputtering (low-temperature sputtering), and ion plating; a wet plating process such as electrolytic plating, immersion plating, and electroless plating: a thermal spraying process; a sol-gel process; an MOD process; and by bonding a metal foil.

A resist material is coated on the metal film, and then cured to form a resist layer corresponding to a shape of the source electrode 20a and the drain electrode 20b. The resist layer is used as a mask to remove unnecessary portions of the metal film. This metal film can be removed by one or more than one in combination of the following exemplary methods, physical etching such as plasma etching, reactive ion etching, beam etching, and photo assist etching; and chemical etching such as wet etching.

Then, the resist layer is removed, providing the source electrode 20a and the drain electrode 20b.

The source electrode 20a and the drain electrode 20b may also be formed in such manner that a conductive material containing conductive particles is applied to form a liquid film on the lower layer 60, and a post treatment (for example, heating, infrared ray irradiation, and ultrasonic wave application) is applied as necessary.

As a method for providing the conductive material, the method described in the process [1] may be used.

In addition, the data lines 301 and the pixel electrodes 303 are also formed in this process.

[3] Process of Forming Organic Semiconductor Layer (Refer to FIG. 5C)

Next, the organic semiconductor layer 30 is formed such that it contacts the source electrode 20a and the drain electrode 20b.

The organic semiconductor layer 30 can be formed in such manner that a solution containing organic semiconductor materials or those precursor is applied to a predetermined region including the region between the source electrode 20a and the drain electrode 20b on the lower layer 60 to form a liquid film, and a post treatment (for example, heating, infrared ray irradiation, and ultrasonic wave application) is applied as necessary.

As a method for providing the solution, the method described in the process 1 may be used.

Figure 3D:
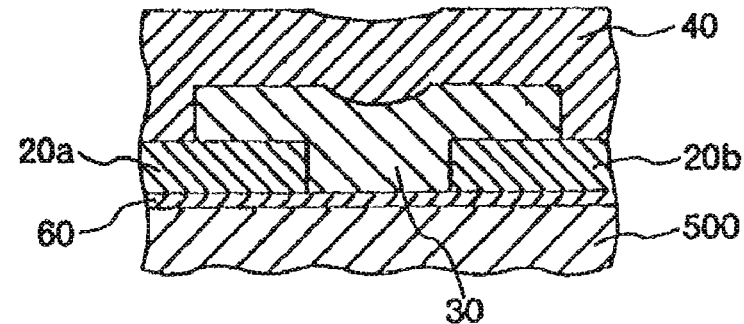

[4] Process of Forming Gate Insulating Layer (Refer to FIG. 3D)

The gate insulating layer 40 is formed such that it covers the source electrode 20a, the drain electrode 20b, and the organic semiconductor layer 30.

The gate insulating layer 40 can be formed by the liquid phase process as is the case with the lower layer 60.

The liquid phase process can preferably prevent the organic semiconductor layer 30 from receiving unnecessary heat, and from deteriorating the characteristics of the organic semiconductor layer 30, further the characteristics of the thin film transistor 1.

In this case, such solvent that does not cause dissolution and swell of the organic semiconductor layer 30 is selected as a solvent for preparing the solution. As such solvent, among the solvents cited in the process 1, especially, solvents mainly containing at least one of ketone solvents, ester solvents, and ether solvents are preferable.

Figure 3E:
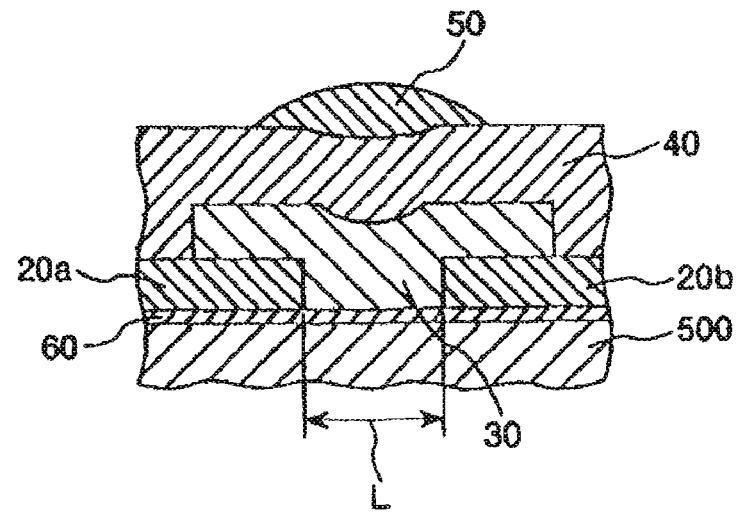

[5] Process of Forming Gate Electrode (Refer to FIG. 3E)

Next, the gate electrode 50 is formed on the gate insulating layer 40 such that it corresponds to the region between the source electrode 20a and the drain electrode 20b.

The gate electrode 50 can be formed in the same manner as the source electrode 20a and the drain electrode 20b.

Particularly, the gate electrode 50 is preferably formed by the liquid phase process using, for example a dispersion liquid containing conductive polymers (PEDOT/PSS), or a dispersion liquid containing, metal particles of colloidal silver, or colloidal copper, as an electrode forming material (conductive material).

In such liquid phase process, for example, the electrode forming material is provided to the gate insulating layer 40 by ink-jetting, being able to easily form the gate electrode 500 having high dimensional accuracy.

In this process, the scanning lines 302 are also formed.

In the embodiment, the scanning lines 302 are formed separately to the gate electrode 50, but may be formed by continuously forming gate electrodes 50 of adjacent thin film transistors 1.

Other structural examples of the thin film transistor 1 will now be described.

Figure 4:
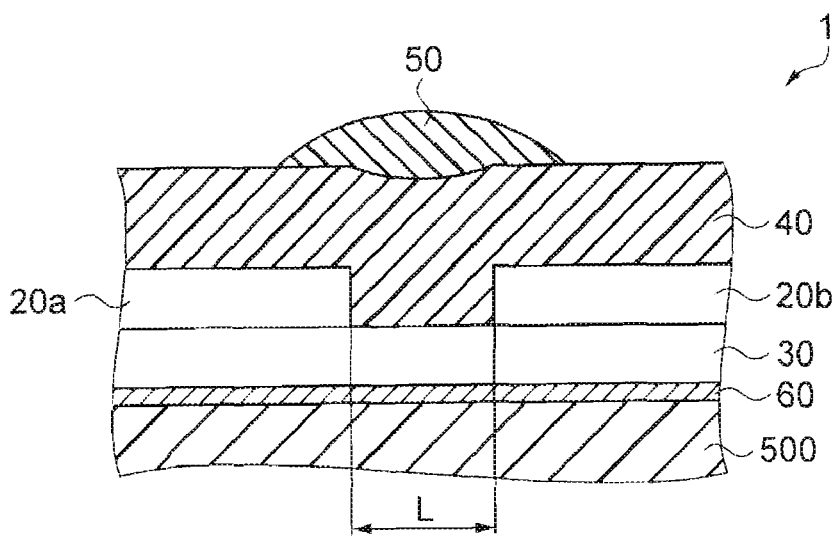
FIG. 4 is a longitudinal sectional view illustrating other structure of the organic thin film transistor of the active matrix device of FIG. 1.
Figure 5:
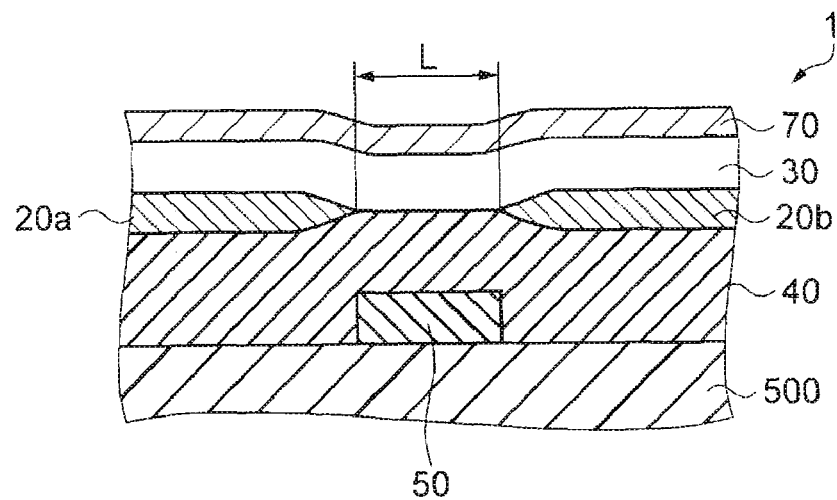
FIG. 5 is a longitudinal sectional view illustrating other structure of the organic thin film transistor of the active matrix device of FIG. 1.
Figure 6:
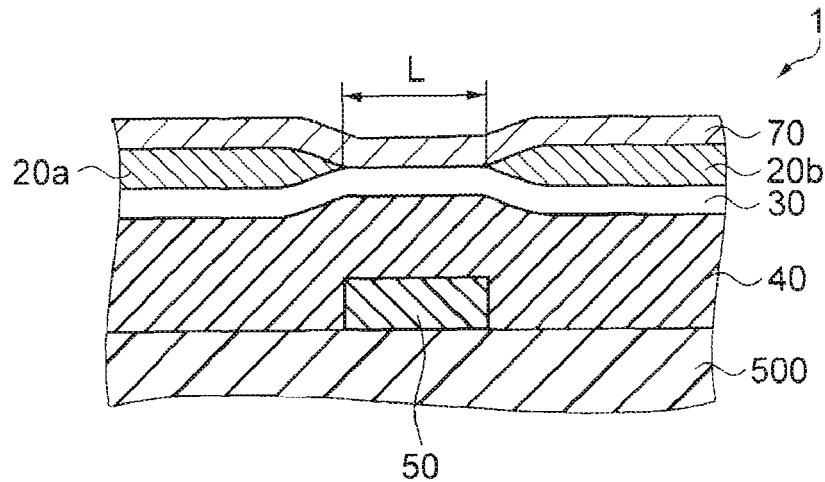
FIG. 6 is a longitudinal sectional view illustrating other structure of the organic thin film transistor of the active matrix device of FIG. 1.

FIGS. 4 to 6 are longitudinal sectional views showing other structural examples of the organic thin film transistor provided to the active matrix device of FIG. 1.

The following description of the thin film transistor 1 shown in FIGS. 4 to 6 focuses primarily on differences from the thin film transistor of FIG. 2, and the description of similar points will be omitted.

In the thin film transistor 1 shown in FIG. 4, the position of the organic semiconductor layer 30 is the only difference, and other structure is same as that of the thin film transistor 1 of FIGS. 2A and 2B.

In particular, in the thin film transistor 1 of FIG. 4, the organic semiconductor layer 30 is provided at the downside of the source electrode 20a and the drain electrode 20b (the substrate 500 side) to cover the lower layer 60.

Such thin film transistor 1 shown in FIG. 4 can provide functions and effects similar to those of the thin film transistor 1 of FIGS. 2A and 213.

In the thin film transistor 1 shown in FIG. 5, the whole configuration is the only difference and other structure is same as that of the thin film transistor 1 of FIGS. 2A and 213.

In particular, the thin film transistor 1 of FIG. 5 is a bottom-gate type thin film transistor in which the gate electrode 50 is located at the downside far from the source electrode 20a and the drain electrode 20b (the substrate 500 side) through the gate insulating layer 40.

Then, a protection layer (a second insulating layer) 70 is provided to cover and contact the organic semiconductor layer 30, and has the same structure as the lower layer 60 of FIGS. 2A and 4.

Such thin film transistor 1 shown in FIG. 5 can provide functions and effects similar to those of the thin film transistor 1 of FIGS. 2A, 2B, and 4.

In the thin film transistor 1 shown in FIG. 6, the position of the organic semiconductor layer 30 is the only difference and other structure is same as that of the thin film transistor 1 of FIG. 5.

In particular, in the thin film transistor 1 of FIG. 6, the organic semiconductor layer 30 is provided at the downside of the source electrode 20*a* and the drain electrode 20*b* (the substrate 500 side) to cover the gate insulating layer 40.

Such thin film transistor 1 shown in FIG. 6 can provide functions and effects similar to those of the thin film transistor 1 of FIGS. 2A, 2B, 4, and 5.

In addition, the thin film transistor 1 shown in FIGS. 4 to 6 can be manufactured in the same manner as the thin film transistor 1 of FIGS. 2A and 2B.

Electronic Device

Next, as an example of an electronic device of the invention, an electrophoretic display mounting an active matrix device as described above will be described.

Figure 7:
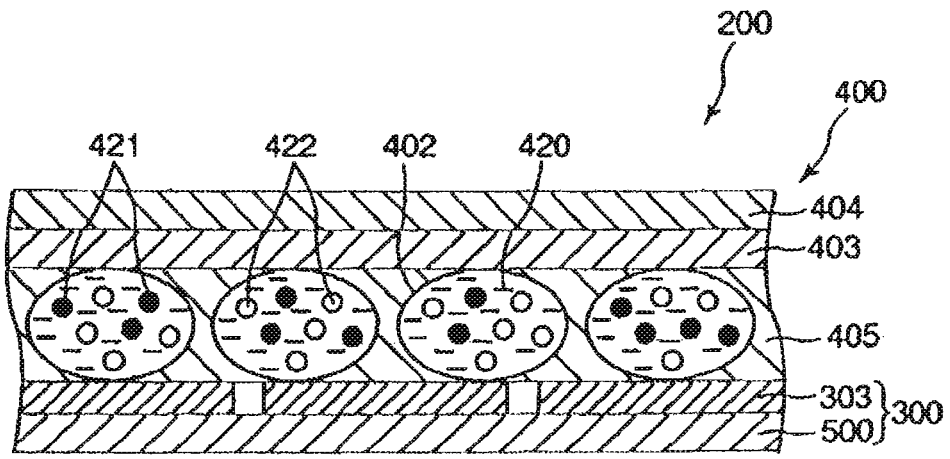
FIG. 7 is a longitudinal sectional view illustrating an electrophoretic display.

FIG. 7 is a longitudinal sectional view illustrating an electrophoretic display. In the following description, the upside in FIG. 7 is described as "up", while the downside is described as "down".

This electrophoretic display 200 shown in FIG. 7 includes the active matrix device (back plane) 300 described above, and an electrophoretic display part (front plane) 400 provided on the active matrix device 300.

The electrophoretic display part (electrophoretic display sheet) 400 is composed of a transparent board 404 having a transparent electrode (common electrode) 403, and microcapsules 402 fixed to the transparent electrode 403 by a binder 405.

The electrophoretic display part 400 is bonded to an active matrix device 301) in such manner that the microcapsules 402 contact the pixel electrodes 303.

In each of the microcapsules 402, electrophoretic dispersion liquid 420 is encapsulated. The electrophoretic dispersion liquid 420 includes plural kinds of electrophoretic particles having different characteristics from each other, namely two kinds of electrophoretic particles 421 and 422 having different charges and colors (hues) in the embodiment.

In such electrophoretic display 200, when one or more of the scanning lines 302 are supplied with selection signals (selection voltages), the thin film transistors 1 connected to the scanning lines 302 supplied with the selection signals (selection voltages) are switched on.

This switching on makes data lines 301 coupled to the thin film transistors 1 be electrically connected to the pixel electrodes 303. Here, if desired data (voltage) are supplied to the data lines 301, the data (voltage) are supplied to the pixel electrodes 303.

This supplying data generates an electric field between the pixel electrodes 303 and the transparent electrode 403. Depending on the direction and strength of the electric field, and properties of the electrophoretic particles 421 and 422, the electrophoretic particles 421 and 422 move electrophoretically in a direction toward either electrode.

On the other hand, if the supply of the selection signals (selection voltage) to the scanning lines 302 is stopped, the thin film transistor 1 are switched off; cutting off the electrical connection between the data lines 301 and the pixel electrodes 303 coupled to the thin film transistors 1.

Accordingly, by supplying or stopping the selection signals to the scanning lines 302 and by supplying or stopping data to the data lines 301 in appropriate combination, a desirable image (information) can be displayed on a display surface side (the transparent substrate 404 side) of the electrophoretic display 200.

In particular, in the electrophoretic display 200 of the embodiment, the electrophoretic particles 421 and 422 are allowed to have different colors from each other, making it possible to display multiple grayscale images.

Further, the electrophoretic display 200 of the embodiment is provided with the active matrix device 300. Therefore, the thin film transistor 1 connected to a specific scanning line 302 can selectively be switched ON/OFF and thus the problem of cross-talk hardly arises, and further, the circuit operation can be speeded up. Consequently, high quality images (information) can be produced.

Moreover, the electrophoretic display 200 of the embodiment operates at a low driving voltage, being able to save electric power.

Note that a display mounting the active matrix device equipped with the thin film transistor 1 described above is not limited to be applied to such electrophoretic display device 200, but can be applied to, for example, a liquid crystal display.

Electronic Equipment

The electrophoretic display 200 can be mounted to various electronic equipment. Electronic equipment of the invention equipped with the electrophoretic display device 200 will now be described.

Electronic Paper

First, an electronic paper to which the electronic equipment of the present invention is applied will be described.

Figure 8:
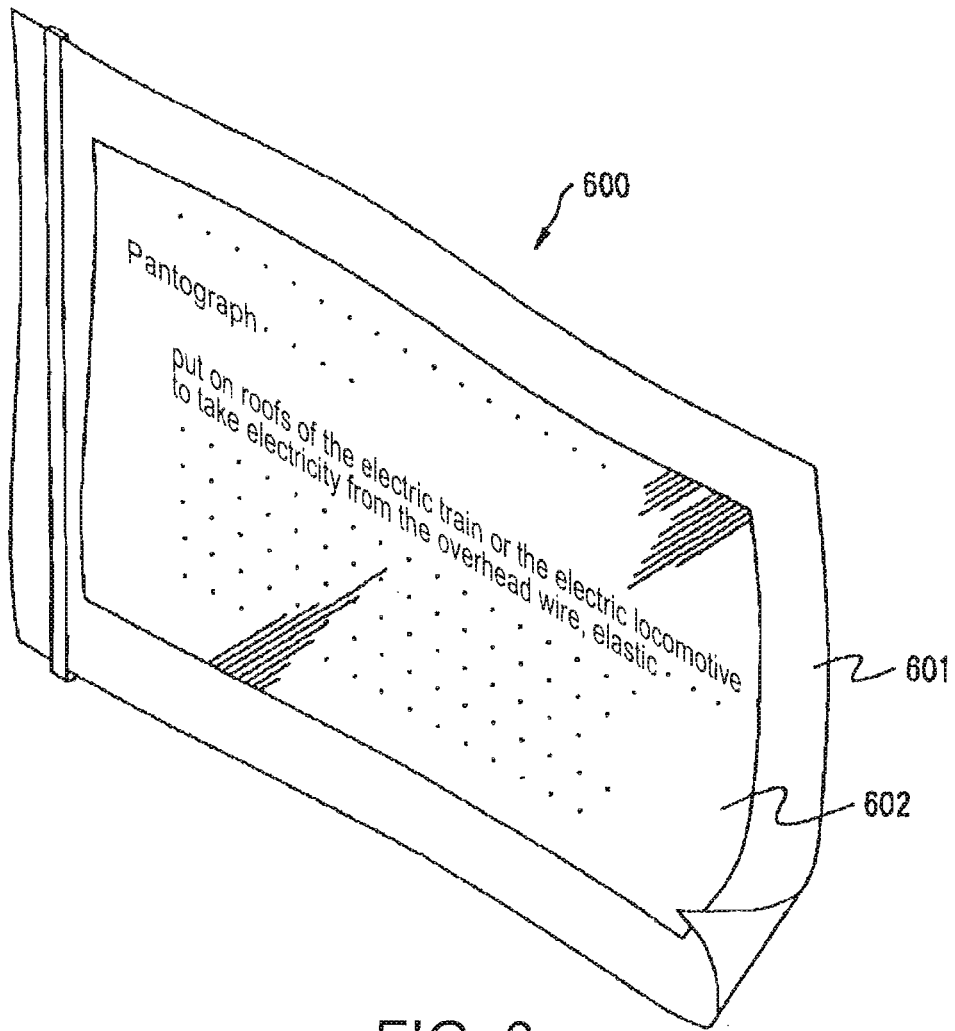
FIG. 8 is a perspective view illustrating an electronic paper to which electronic equipment of the present invention is applied.

FIG. 8 is a perspective view illustrating an electronic paper to which the electronic equipment of the present invention is applied.

This electronic paper 600 shown in the figure includes a body 601 and a display unit 602. The body 601 is composed of a rewritable sheet having a texture and flexibility like a paper.

In the electronic paper 600, the display unit 602 includes the electrophoretic display 200 described above.

Display

Next, a display to which the electronic equipment of the present invention is applied will be described.

Figure 9A:
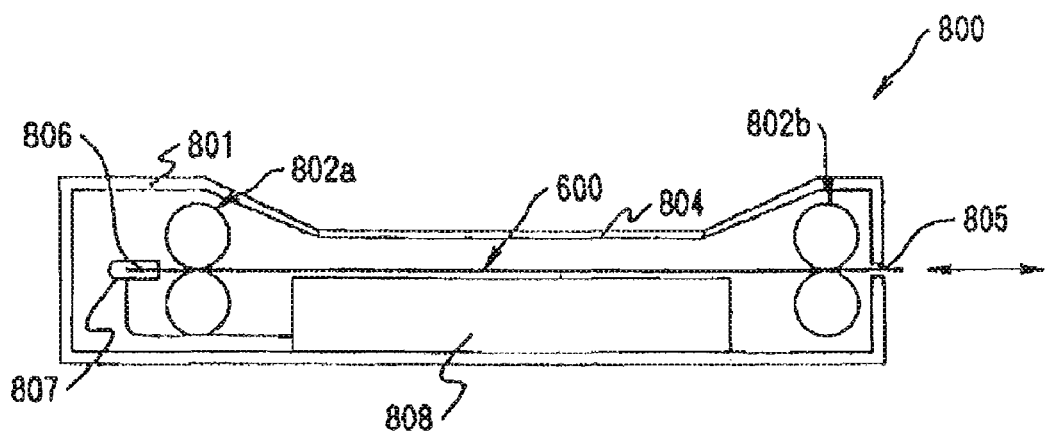
FIGS. 9A and 9B are schematic views illustrating a display to which electronic equipment of the present invention is applied.
Figure 9B:
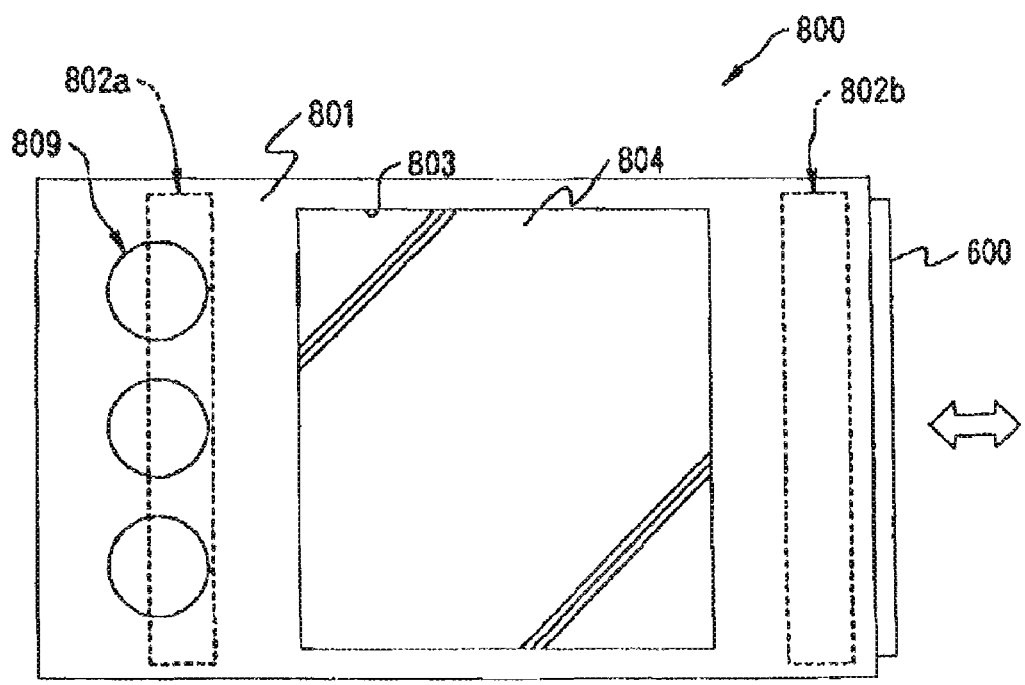

FIGS. 9A and 9B are schematic views illustrating a display to which the electronic equipment of the present invention is applied, where FIG. 9A is a sectional view and FIG. 9B is a plan view.

This display 800 shown in the figure includes a body 801 and the electronic paper 600 that is detachably provided to the body 801. The electronic paper 600 has the above-mentioned structure, that is, the one shown in FIG. 8.

The body 801 has an insertion slot 805 on its side (right side in the figure) into which the electronic paper 600 is insertable. The body 801 also has a pair of feed rollers 802*a* and a pair of feed rollers 802*b* therein. When the electronic paper 600 is inserted through the insertion slot 805 into the body 801, the electronic paper 600 is fed to be set in the body 801) in a manner sandwiched by the pairs of feed rollers 802*a* and 802*b*.

Also, on the display surface side (near side of FIG. 7B) of the main body 801, a rectangular hollow part 803 is formed with a transparent glass plate 804 embedded therein. Accordingly, the electronic paper 600 set in the body 801 is visible from the outside of the body 801. In other words, the display 800 allows the electronic paper 600 set in the body 801 to be visible through the transparent glass plate 804 so as to make up the display surface.

Also, a terminal 806 is provided at an end in the direction toward which the electronic paper 600 is inserted (left side in the figure). The body 801 is provided with a socket 807, thereinside, that is to be coupled to the terminal 806 when the electronic paper 600 is set in the body 801. The socket 807 is electrically coupled with a controller 808 and a control part 809.

The electronic paper 600 is detachably set in the body 811 of the display 800, so that the electronic paper 600 can be used out of the body 801 for portable use, as well.

In the display 800, the electronic paper 600 includes the electrophoretic display 200 described above.

Note that the application of the electronic equipment of the present invention is not limited to those described above. Examples of the application include a television, a video tape recorder of a viewfinder type or a monitor viewing type, a car navigation system, a pager, a personal digital assistance an electronic calculator, an electronic newspaper, a word processor, a personal computer, a workstation, a picture phone, a POS terminal, and a device equipped with a touch panel. The electrophoretic display 200 can be applied to a display part of the above various electronic equipment.

While the organic semiconductor device, the electronic device, and the electronic equipment of the invention are described based on the illustrated embodiments thus far, but the invention is not limited to those embodiments.

Example 1

1. Preparation of the Monomers

First, the following monomer compositions A to C were prepared.
Monomer composition A;
First polymerizable monomer: 4,4'-(9-fluorenylidene)bis (2-phenyloxyethylacrylate) (from Osaka Gus Chemicals, Co., Ltd.)
Second polymerizable monomer: pentaerythritol triacrylate (from Toagosei Co., Ltd., Product name: M-305)
Structural formula I/Structural formula II=20 mol %/80 mol %
Photo polymerization initiator: Irgacure907 (from Ciba Specialty Chemicals K.K.)
(Structural Formula I+Structural Formula II)/photo polymerization initiator=100 wt %/4 wt %
Monomer Composition B;
Structural Formula I: bisphenol fluorene diglycidyl ether (from Osaka Gus Chemicals, Co., Ltd.)
Structural Formula II: dipentaerythritol hexaacrylate (from Shin-Nakamura Chemical Co., Ltd., Product name: NK Ester A-DPH)
Structural formula I/Structural formula II=50 mol %/50 mol %
Photo polymerization initiator: Irgacure184 (from Ciba Specialty Chemicals K.K.)
(Structural Formula I+Structural Formula II)/Photo polymerization initiator=100 wt %/4 wt %
Monomer Composition C;
Structural Formula I: 4,4'-(9-fluorenylidene)bis(2-phenoxyethylacrylate) (from Osaka Gus Chemicals, Co., Ltd.)
Structural Formula II: dipentaerythritol pentaacrylate and hexaacrylate (from Toagosei Co., Ltd., Product name: M-402)
Structural formula I/Structural formula II=80 mol %/20 mol %
Photo polymerization initiator: Irgacure907 (from Ciba Specialty Chemicals K.K.)/Irgacure184 (from Ciba Specialty Chemicals K.K.)=50 wt %/50 wt %
(Structural Formula I+Structural Formula II)/photo polymerization initiator=100 wt %/5 wt %

2. Manufacture of Thin Film Transistor 200 thin film transistors were manufactured for each of examples 11 to 13, 21, and 31, and comparative examples 11, 21, 31, and 32 as described below.

Example 11

1) First, 150 µm thickness of SUS 304 substrate was prepared. Then the SUS 304 substrate was washed with water and dried.

2) A solution of the monomer composition A of which solvent is carbitol acetate and solid content was prepared to be 10 wt/vol % was applied on the substrate by spin-coating (at 1500 rpm), and then 7 mW/cm$^2$ intensity of ultraviolet was irradiated from a direction perpendicular to the substrate for 120 seconds. Then the substrate was heated at 100 degrees Celsius for 10 minutes to effect polymerization, completing the reaction. This process provided a lower layer (second insulating layer) having an average thickness of 3 µm.

3) A gold thin film was formed on the lower layer by vapor deposition, and next a resist layer was formed thereon by photolithography. Then the gold thin film was etched by using the resist layer as a mask.

This process provided a source electrode and a drain electrode having an average thickness of 100 nm. In addition, a channel length L and a channel width V were made respectively 20 µm and 1 mm.

4) A toluene solution containing 1% wt/vol of poly(9,9-dioctylfuerene-co-bithiophene) (F8T2) was applied on the lower layer provided with the source electrode and the drain electrode, by ink-jetting, and then the substrate was dried at 60 degrees Celsius for 10 minutes.

This process provided an organic semiconductor layer having an average thickness of 50 nm.

5) A butyl acetate solution containing 5% wt/vol of polymethylmethacrylate (PMMA) was applied by spin-coating (at 2400 rpm) so as to coat the organic semiconductor layer; the source electrode, and the drain electrode, and then the substrate was dried at 60 degrees Celsius for 10 minutes.

This process provided a gate insulating layer having an average thickness of 500 nm.

6) An Ag particle dispersion liquid was applied by ink-jetting to the region, corresponding to the region between the source and drain electrodes, of the gate insulating layer, and then the substrate was dried at 80 degrees Celsius for 10 minutes.

This process provided a gate electrode having an average thickness of 100 nm and an average width of 30 µm.

Thus, the thin film transistor shown in FIG. 2 was obtained.
An OFF-current value was $1.0 \times 10^{-13}$ A.

Example 12

Each thin film transistor was manufactured in the same manner as Example 11 except for using the monomer composition B as substitute for the monomer composition A.

Example 13

Each thin film transistor was manufactured in the same manner as Example 11 except for using the monomer composition C as substitute for the monomer composition A.

Example 21

Each thin film transistor was manufactured in the same manner as Example 11 except for forming a 50 nm organic semiconductor layer with pentacene by vacuum deposition at a vacuum of $1.33 \times 10^{-4}$ Pa or less, in the process 4).

Example 31

Each thin film transistor was manufactured in the same manner as Example 11 except for forming a 50 nm semiconductor layer with copper phthalocyanine by vacuum deposition at a vacuum of $11.33 \times 10^{-4}$ Pa or less, in the process 4).

Comparative Example 11

Each thin film transistor was manufactured in the same manner as Example 11 except for omitting to form a lower layer. An OFF-current value was $5.0 \times 10^{-12}$ A.

Comparative Example 21

Each thin film transistor was manufactured in the same manner as Example 21 except for omitting to form a lower layer.

Comparative Example 31

Each thin film transistor was manufactured in the same manner as Example 31 except for omitting to form a lower layer.

Comparative Example 32

Each thin film transistor was manufactured in the same manner as Example 31 except for forming a lower layer in such process that a chloroform solution containing 10 wt/vol % of polystyrene was applied on a substrate by spin-coating (at 2000 rpm) and then the substrate was dried at 120 degrees Celsius for 10 minutes in the process 2).

3. Evaluation

Transfer characteristics in nitrogen ($N_2$) of the thin film transistors manufactured in respective examples and comparative examples were measured.

Degrees of carrier mobility ON-OFF ratios which are ratios between ON current and OFF current and threshold voltages (Vth) were calculated based on obtained measurement results.

Table 1 shows the measurement results.

Here, Table 1 shows respective degrees of carrier mobility, ON-OFF ratios, and threshold voltages.

Further, each value in Table 1 denotes an average value of the 200 thin film transistors.

TABLE 1

| | Lower Layer | Organic Semiconcuctor Layer | Degree of Carrier Mobility [cm²/Vs] | ON-OFF ratio | Threshold Voltage (Vth) [V] |
|---|---|---|---|---|---|
| Example 11 | Monomer composition A | F8T2 | $1.7 \times 10^{-2}$ | $8.8 \times 10^{6}$ | −6 |
| Example 12 | Monomer composition B | F8T2 | $1.2 \times 10^{-2}$ | $8.4 \times 10^{6}$ | −5 |
| Example 13 | Monomer composition C | F8T2 | $1.6 \times 10^{-2}$ | $8.5 \times 10^{6}$ | −4 |
| Comparative Example 11 | — | F8T2 | $8.0 \times 10^{-3}$ | $2.4 \times 10^{5}$ | −12 |
| Example 21 | Monomer composition A | pentacene | $7.2 \times 10^{-1}$ | $5.5 \times 10^{6}$ | −3 |
| Comparative Example 21 | — | pentacene | $4.0 \times 10^{-2}$ | $2.0 \times 10^{4}$ | 2 |
| Example 31 | Monomer composition A | copper phthalocyanine | $6.1 \times 10^{-4}$ | $1.4 \times 10^{4}$ | −2 |
| Comparative Example 31 | — | copper phthalocyanine | $3.0 \times 10^{-4}$ | $1.2 \times 10^{3}$ | −2.5 |
| Comparative Example 32 | polystyrene | copper phthalocyanine | $4.5 \times 10^{-4}$ | $1.0 \times 10^{3}$ | −2.1 |

As shown Table 1, it was proved that the thin film transistors of respective examples improved in terms of the degree of carrier mobility, the ON-OFF ratio (especially, remarkable improvement in the ON-OFF ratio), and large-shift prevention of the threshold voltage, compared to the thin film transistors of the corresponding comparative examples.

The entire disclosure of Japanese Patent Application No. 2006-222304, filed Aug. 17, 2006 is expressly incorporated by reference herein.

What is claimed is:

1. A semiconductor device, comprising:
a source electrode;
a drain electrode;
an organic semiconductor layer made of an organic semiconductor material;
a gate electrode that applies an electric field to the organic semiconductor layer;
a gate insulating layer that insulates the gate electrode from the organic semiconductor layer; and
a lower insulating layer,
the organic semiconductor layer being located between the gate insulating layer and the lower insulating layer, and the lower insulating layer being composed of a polymer having a fluorene skeleton,
the gate insulating layer directly contacting one of the source electrode and the drain electrode,
the gate insulating layer covering a side surface of the organic semiconductor layer,
the side surface crossing to a direction from the source electrode to the drain electrode, and
the polymer being obtained by copolymerizing a first polymerizable monomer, the first polymerizable monomer including the fluorene skeleton, and a second polymerizable monomer, the second polymerizable monomer including at least one of an epoxy group, an oxetane group, an acrylic acid group, and a methacrylic acid group; wherein
the first polymerizable monomer has a structure shown in Structural Formula 1, and the second polymerizable monomer has a structure shown in Structural Formula 2 or Structural Formula 3:

[Structural Formula 1]

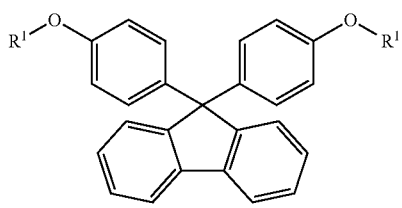
(1)

[Structural Formula 2]

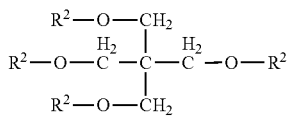
(2)

[Structural Formula 3]

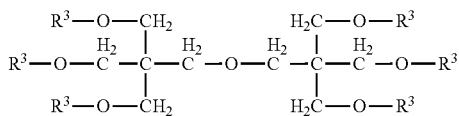
(3)

(wherein $R^1$, $R^2$, and $R^3$ in above formulas respectively represent the following: all of $R^1$s are same substituents and have a hydrogen atom or a structure shown in any of Formulas 4 to 8; at least two of $R^2$s are same substituents and $R^2$s have a hydrogen atom or a structure shown in any of Formulas 4 to 8; and at least three of $R^3$s are same substituents and $R^3$s have a hydrogen atom or a structure shown in any of Formulas 4 to 8):

[Formula 4]

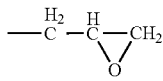
(4)

[Formula 5]

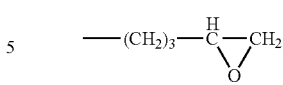
(5)

[Formula 6]

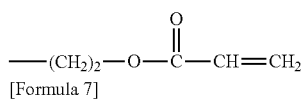
(6)

[Formula 7]

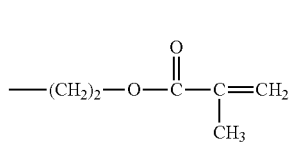
(7)

[Formula 8]

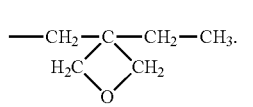
(8)

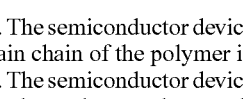

2. The semiconductor device according to claim 1, wherein a main chain of the polymer includes an oxygen atom.

3. The semiconductor device according to claim 1, wherein the polymer has a polyester skeleton.

4. The semiconductor device according to claim 1, wherein the polymer includes a first structural portion derived from the first polymerizable monomer and a second structural portion derived from the second polymerizable monomer, and is 25 mol % to 75 mol % of the first structural portion.

5. The semiconductor device according to claim 1, wherein the organic semiconductor material of the organic semiconductor layer has crystallinity.

6. The semiconductor device according to claim 1, wherein the organic semiconductor layer is located between the lower insulating layer and the gate electrode.

7. The semiconductor device according to claim 1, wherein an average thickness of the lower insulating layer is 0.01 μm to 10 μm.

8. An electronic device, comprising the semiconductor device according to claim 1.

9. Electronic equipment, comprising the electronic device according to claim 8.

10. The semiconductor device according to claim 1, wherein the gate insulating layer is continuous and covers the organic semiconductor layer and portions of the source and drain electrodes.

* * * * *